(12) United States Patent
Lin et al.

(10) Patent No.: US 9,263,117 B2
(45) Date of Patent: Feb. 16, 2016

(54) WRITING METHOD FOR SOLID STATE DISK

(71) Applicant: QUANTA STORAGE INC., Taoyuan County (TW)

(72) Inventors: Cheng-Yi Lin, Taoyuan County (TW); Yi-Long Hsiao, Taoyuan County (TW)

(73) Assignee: QUANTA STORAGE INC., Taoyuan County (TW)

( * ) Notice: Subject to any disclaimer, the term of this patent is extended or adjusted under 35 U.S.C. 154(b) by 15 days.

(21) Appl. No.: 14/505,856

(22) Filed: Oct. 3, 2014

(65) Prior Publication Data

US 2015/0255147 A1  Sep. 10, 2015

(30) Foreign Application Priority Data

Mar. 6, 2014  (CN) .......................... 2014 1 0079814

(51) Int. Cl.
*G06F 9/26*  (2006.01)
*G11C 11/4093*  (2006.01)

(52) U.S. Cl.
CPC ................... *G11C 11/4093* (2013.01)

(58) Field of Classification Search
USPC ...................... 711/219; 365/189.05
See application file for complete search history.

(56) References Cited

U.S. PATENT DOCUMENTS

2015/0220274 A1*  8/2015  Lin ....................... G06F 3/0611
711/103

* cited by examiner

*Primary Examiner* — Hoai V Ho
(74) *Attorney, Agent, or Firm* — Rabin & Berdo, P.C.

(57) ABSTRACT

A writing method for a solid state disk is disclosed. The method comprises following steps: A writing unit is arranged in a buffer memory, wherein plane addresses of the writing unit are in one-to-one correspondence with non-volatile memories of the solid state disk. A writing data is received. A reordered plane address of the writing unit is obtained by using the residue of the logical allocation address of the writing data dividing the plane address number. Whether the reordered plane address is empty is checked. If the reordered plane address is not empty, the next plane address is shifted and the plane address is reordered. If the reordered plane address is empty, the writing data is buffered to the reordered plane address and the logical allocation address of the writing data is arranged in order.

8 Claims, 9 Drawing Sheets receive writing data LAA(n) from a host:

LAA(n)

arrange writing units in the buffer memory, wherein each writing unit has m plane addresses PA :

reorder the plane address :

n/m => residue k => PA(k)

buffer the writing data to the buffer memory the reordered plane address is not empty :

reorder the next plane address by using the shifting technique :

(n+1)/m => residue k +1 => PA(k+1)

buffer the writing data to the next plane address:

receive writing data LAA(0, 8, 2, 3, 4, 5, 6, 7, 1, 9, 10, 11, 12, 13, 14, 15) from a host buffer the writing dataa to a buffer memory:

LAA(0):0 /8 = residue 0 = PA(0)

LAA(8):8 /8 = residue 0 = PA(0+1)

LAA(2):2 /8 = residue 2 = PA(2)

LAA(3):3 /8 = residue 3 = PA(3)

LAA(4):4 /8 = residue 4 = PA(4)

LAA(5):5 /8 = residue 5 = PA(5)

LAA(6):6 /8 = residue 6 = PA(6)

LAA(7):7 /8 = residue 7 = PA(7)

writing unit 1 writes SSD:

WRITING METHOD FOR SOLID STATE DISK

This application claims the benefit of People's Republic of China application Serial No. 201410079814.9, filed Mar. 6, 2014, the subject matter of which is incorporated herein by reference.

BACKGROUND OF THE INVENTION

1. Field of the Invention

The invention relates in general to a writing method for a solid state disk, and more particularly to a writing method for a solid state disk in which data is reordered in a buffer memory before being written to a non-volatile memory.

2. Description of the Related Art

Solid state disk (SSD) is formed by integrating a plurality of non-volatile memories (NVMs) into a single storage device. The solid state disk, having a fast data transmission rate which is beneficial to the transmission of a large volume of data, has become an essential data storage device to modern computer systems.

As indicated in FIG. 1, a schematic diagram of a data writing procedure of a solid state disk according to prior art is shown. A host, such as a computer system, uses a processor to output writing data with logical allocation address (LAA) such as writing data LAA(0, 8, 2, 3, 4, 5, 6, 7, 1, 9, 10, 11, 12, 13, 14, 15). The writing data is received by a controller of a solid state disk and buffered in a buffer memory. Based on the order of reception, the writing data which correspond to non-volatile memories 0-7 are divided into a plurality of writing units, such as writing unit 1 and writing unit 2, wherein the writing data 1 is LAA (0, 8, 2, 3, 4, 5, 6, 7), and the writing data 2 is LAA (1, 9, 10, 11, 12, 13, 14, 15). Then, the writing data are distributed to writing units and stored to corresponding non-volatile memories in parallel via respective first in first out (FIFO) channels of non-volatile memories 0-7, such that the write rate can be increased.

When reading data, the solid state disk receives a read request from the host, and distributes the read request and registers it in respective read request queues of the non-volatile memories. Then, based on the order of the read request in the read request queues, the data stored in the non-volatile memories are read in parallel on a FIFO basis, and are outputted via respective FIFO channels. The outputted data are arranged by the controller and stored in a dynamic random access memory (DRAM) of the host. Therefore, through the use of respective FIFO channels of the non-volatile memories, the solid state disk can read data in parallel via multi-channels to increase the read rate.

However, when the host needs to read data LAA(0,1,2,3, 4,5,6,7), the non-volatile memory 0 cannot read and output two required data LAA(0,1) because each non-volatile memory of the solid state disk is restricted by its corresponding FIFO channel. In the first schedule, the non-volatile memory 0 can only read data LAA(0) and output LAA(0) together with LAA(2,3,4,5,6,7) read by the non-volatile memories 2,3,4,5,6,7 in parallel. In the second schedule, the non-volatile memory 0 alone reads and outputs data LAA(1). Under such design, the solid state disk takes a longer time to read data, and multi-channel parallel reading efficiency of the solid state disk will be reduced.

The solid state disk distributes the received writing data to each non-volatile memory and further uses parallel multi-channels to increase the writing rate. However, when data is written based on the order of reception alone, different writing data with continuous or similar logical allocation addresses may be written to the same non-volatile memory. When reading data, due to the jamming in the FIFO channel, the overall read/write efficiency of the solid state disk will deteriorate. Therefore, the solid state disk still has many problems to tackle with when it comes to the writing method.

SUMMARY OF THE INVENTION

The invention is directed to a writing method for a solid state disk. The writing data are reordered and buffered in the plane addresses of writing units, such that the writing data are written to adjacent non-volatile memories according to the ranking of logical allocation address and the read rate can thus be increased.

According to one embodiment of the present invention, a writing method for a solid state disk is provided. Based on the logical allocation address of the writing data, the writing data is reordered and buffered to a plane address whose ordinal number is equivalent to the residue of the address ordinal number dividing the plane address number.

According to another embodiment of the present invention, a writing method for a solid state disk is provided. For a buffered non-empty plane address, the plane address of the writing data is reordered by shifting the plane address, such that the order of the writing data in adjacent non-volatile memories can be maintained.

In order to achieve the above objects, the invention provides a writing method for a solid state disk. The method comprises following steps: a writing unit is arranged in a buffer memory, wherein plane addresses of the writing unit are in one-to-one correspondence with non-volatile memories of the solid state disk; a writing data having logical allocation address is received; a reordered plane address of the writing unit is obtained by using the residue of the address ordinal number of the logical allocation address of the writing data dividing the plane address number; if the reordered plane address which is checked is not empty, the next plane address is shifted and the plane address is reordered; if the reordered plane address is empty, the writing data is buffered to the reordered plane address and the logical allocation address of the writing data is reordered.

The writing method for a solid state disk further comprises following steps: after the writing data is buffered, if the plane address of the writing unit which is checked is full, the writing data buffered in the plane address of the writing unit is written to a corresponding non-volatile memory; after the writing unit is written to the non-volatile memory, if the reception of the writing data which is checked is not completed, the method continues to arrange a next writing unit and receive a writing data, wherein the arranged writing unit can be realized by a writing unit emptied and used as a next writing unit or a space found in the buffer memory and used as a next writing unit.

The above and other aspects of the invention will become better understood with regard to the following detailed description of the preferred but non-limiting embodiment(s). The following description is made with reference to the accompanying drawings.

DETAILED DESCRIPTION OF THE INVENTION

The technologies adopted to achieve the objects of the invention and the effects thereof are disclosed below in a number of exemplarily embodiments with accompanying drawings.

Figure 1:
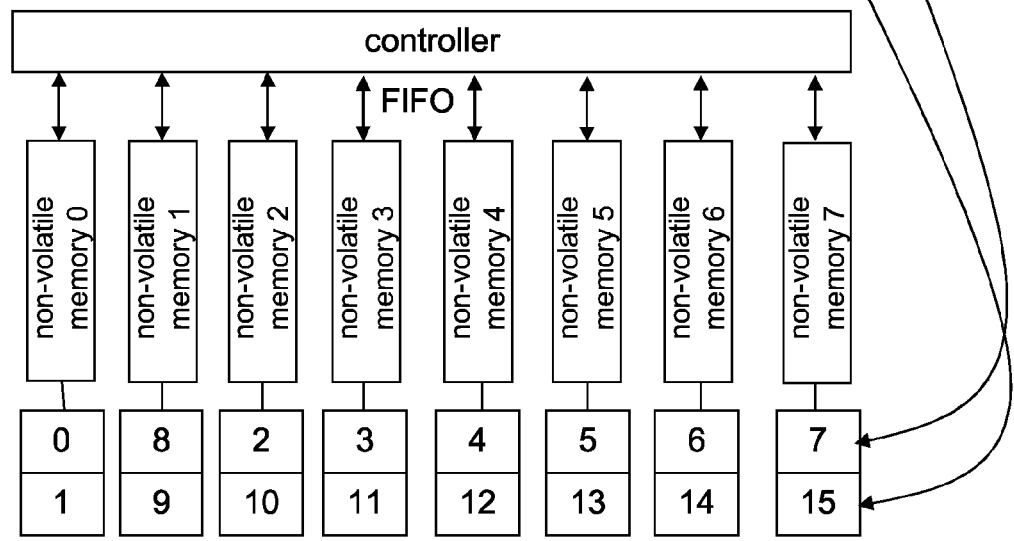
FIG. 1 is a schematic diagram of a data writing procedure of a solid state disk according to prior art.
Figure 2:
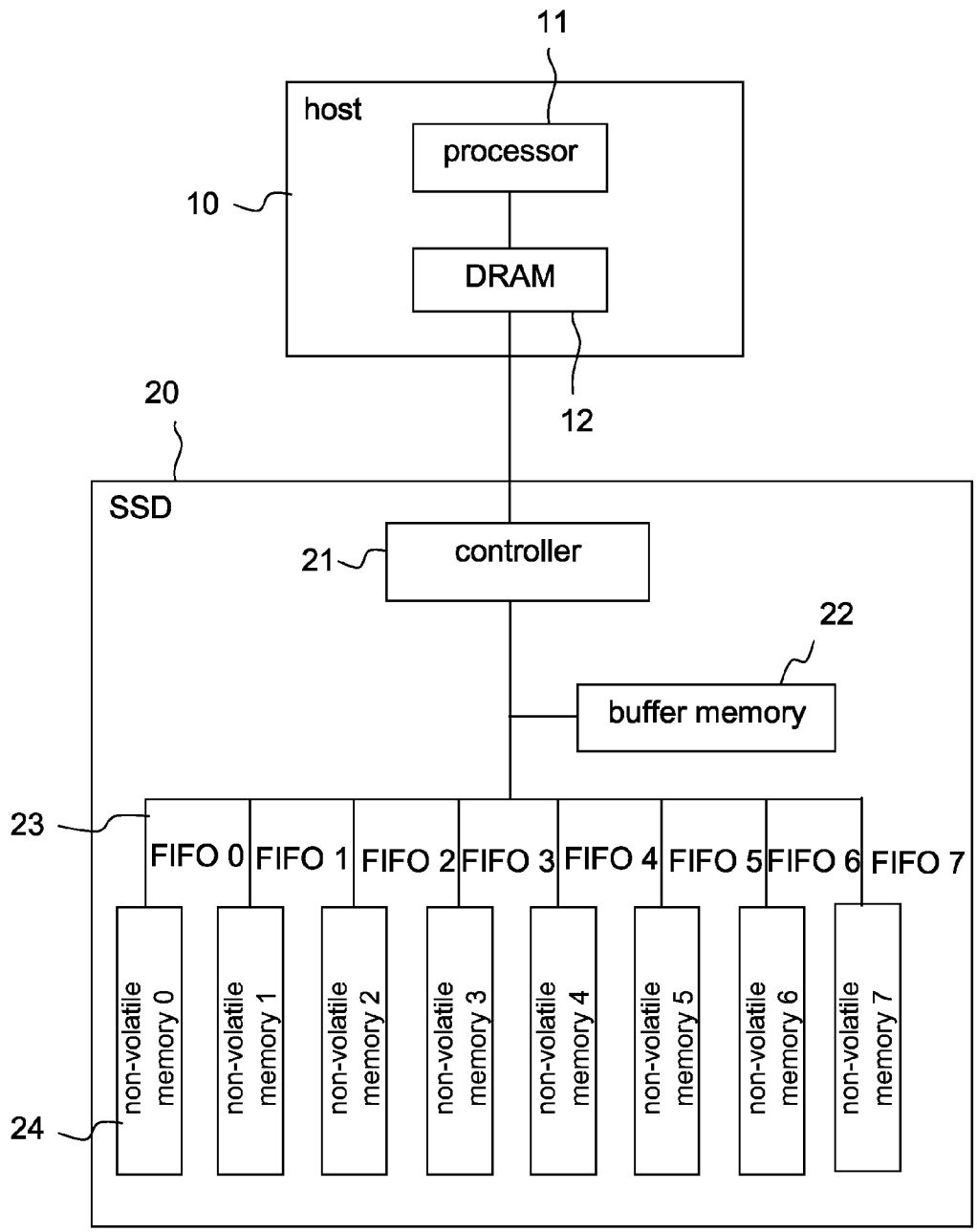
FIG. 2 is a system structural diagram of a solid state disk according to an embodiment of the invention.

Referring to FIG. 2, a system structural diagram of a solid state disk 20 according to an embodiment of the invention is shown. The host 10 comprises a processor 11 and a dynamic random access memory (DRAM) 12, wherein the processor 11 outputs a data writing request and a data reading request, and the DRAM 12 temporarily stores the read data. The solid state disk 20 of the invention is connected to the host 10, and comprises a controller 21, a buffer memory 22, a FIFO channels 23 and 8 non-volatile memories 24. The controller 21 incorporates with the buffer memory 22, and integrates the non-volatile memories 24, which are connected to and in one-to-one correspondence with the m FIFO channels 23, into one single storage device used as the main data storage device of the host. In the present embodiment, the number of non-volatile memories is exemplified by 8, that is, the solid state disk 20 comprises 8 non-volatile memories 24 (the 0-th to the seventh non-volatile memory), but the invention is not limited thereto.

When the processor 11 of the host 10 outputs writing data, the outputted writing data is received by the controller 21 of the solid state disk 20, buffered in the buffer memory 22 and reordered to form several writing units. The writing data of the writing unit is stored to the non-volatile memories 24 in parallel via respective FIFO channels 23 in one-to-one correspondence with the non-volatile memories 24. When the host 10 reads data, the solid state disk 20 receives a read request, and further distributes the read request and registers it in a read request queue of each non-volatile memory 24. Then, based on the order of the read request in the read request queue of each non-volatile memory 24, the data stored in the non-volatile memories 24 are read in parallel according to FIFO principle and outputted via respective FIFO channels 23 for the host to use.

Figure 3:
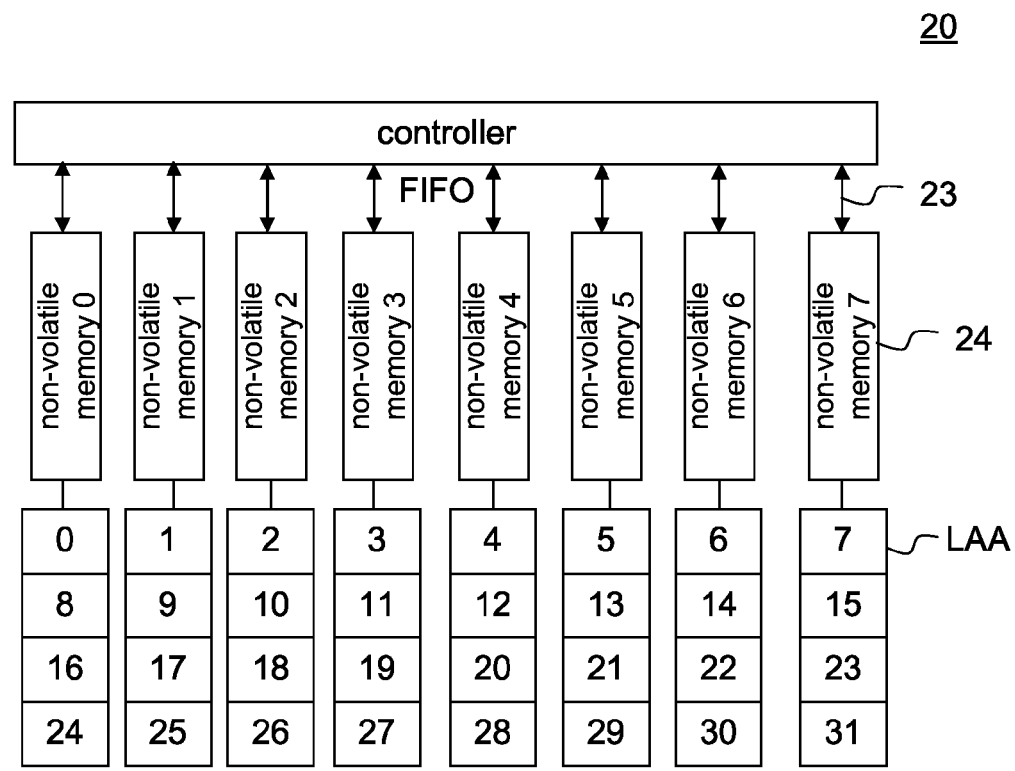
FIG. 3 is an ideal storage state of the data written to a solid state disk according to an embodiment of the invention.

As indicated in FIG. 3, an ideal storage state of the data written to a solid state disk 20 according to an embodiment of the invention is shown. The data written or read by the user during the same working period normally belongs to jobs of the same nature, and has continuous or similar logical allocation addresses (LAA). Suppose the continuous or similar logical allocation addresses in adjacent non-volatile memories 24 are rearranged in an ideal order according to the ranking of the logical allocation address as indicated in FIG. 3. When reading data having continuous logical allocation addresses, such as data LAA (2,3,4,5,6,7,8,9), the jamming in the FIFO channels 23 can be avoided, and the read rate can thus be increased.

Figure 4:
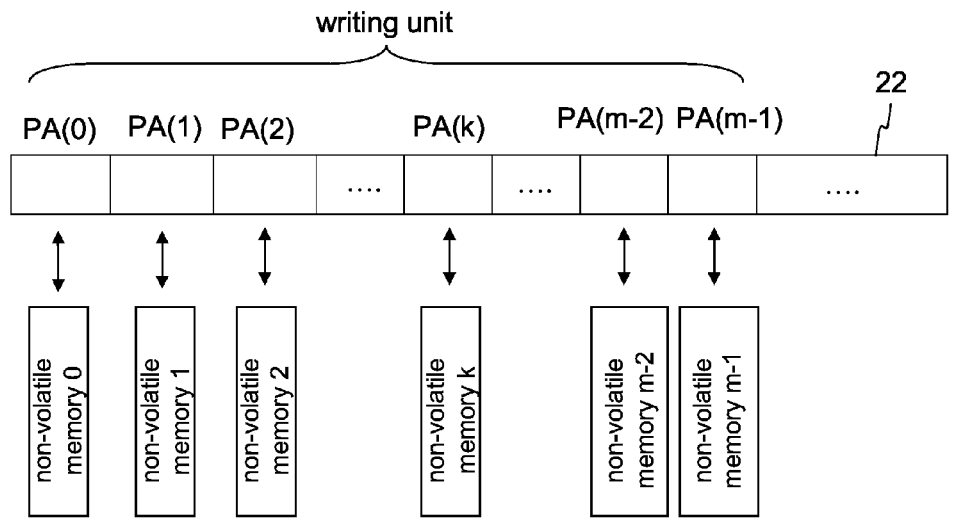
FIG. 4 is a schematic diagram of procedures of rearranging the plane address of the writing data according to an embodiment of the invention.
Figure 4:
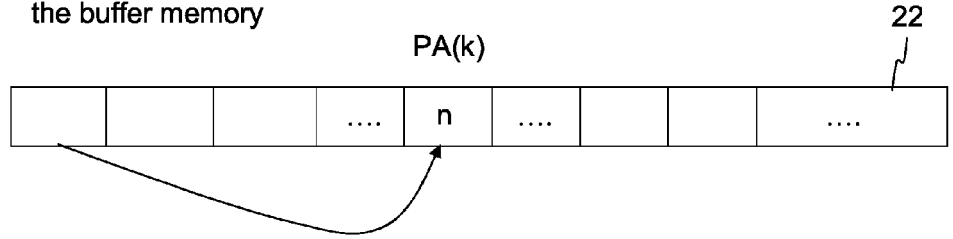

As indicated in FIG. 4, a schematic diagram of procedures of rearranging the plane address of the writing data according to an embodiment of the invention is shown. For the writing data to be rearranged in adjacent non-volatile memories according to the order of the logical allocation address of the writing data, a writing unit corresponding to the m non-volatile memories of the solid state disk is arranged in the buffer memory 22 with respect to the logical allocation address LAA(n) of the writing data received from the host. The writing unit has m plane addresses (PA), that is, PA(0), PA(1), PA(2), . . . , PA(m−2), and PA(m−1), which are in one-to-one correspondence with the m non-volatile memories 24. The writing data buffered in each of the plane addresses PA(0)~PA(m−1) only corresponds to one of the non-volatile memories 0~m−1. Then, the plane address PA(k) of the writing unit is obtained by using the residue k of the address ordinal number n of the logical allocation address LAA(n) of the writing data dividing the plane address number m. Then, the plane address of the writing data of the writing unit of the buffer memory 22 is reordered. For example, the writing data LAA(n) which would otherwise be buffered to a plane address according to the original order is now buffered to the plane address PA(k) as indicated by an arrow.

The invention reorders the plane address in which the writing data is buffered. Since the logical allocation address of each writing data is allocated by using the residue of the m plane addresses of the writing unit, the writing data is arranged and buffered in the plane address of the writing unit according to the ranking of the logical allocation address LAA(n). When the writing unit is written to the non-volatile memories with one-to-one correspondence, the order of the writing data in adjacent non-volatile memories will be the same as the ranking of the logical allocation address LAA(n) of the writing data.

However, the data written by the user during the same working period may belong to jobs which have similar property or the same property, and therefore have a scattered distribution in logical allocation address. It is possible that in a writing unit different writing data may have the same reordered plane address. The reordered plane address of a latter writing data is already occupied by an earlier writing data, hence resulting in non-empty plane address, which prevents the latter writing data from being buffered to its reordered plane address according to the ranking of the logical allocation address LAA(n).

Figure 5:
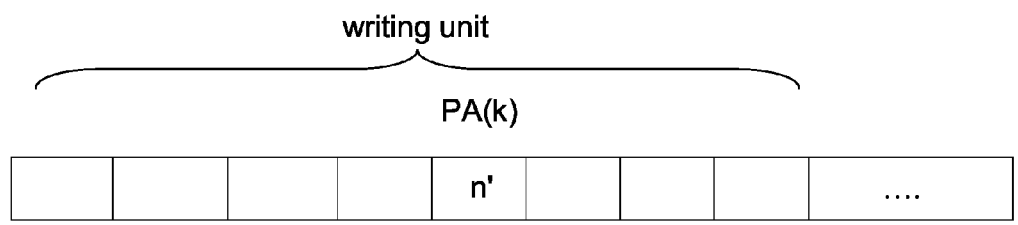
FIG. 5 is a schematic diagram of shifting the plane address of the writing data according to an embodiment of the invention.
Figure 5:
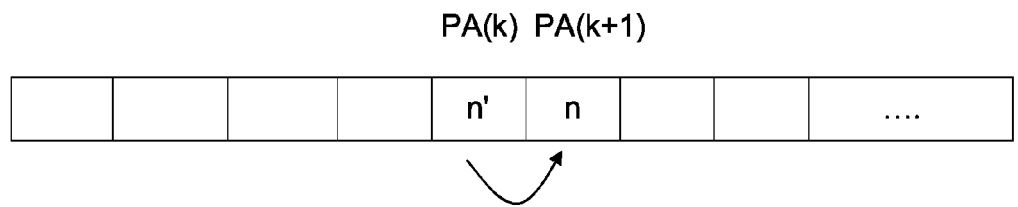

As indicated in FIG. 5, a schematic diagram of shifting the plane address of the writing data according to an embodiment of the invention is shown. As disclosed above, the plane address may be occupied by the earlier writing data. The invention aims to make the writing data arranged in a continuous manner according to its ranking of logical allocation address. After the reordered plane address PA(k) of the writing unit is obtained for the logical allocation address LAA(n) of the writing data, whether the reordered plane address PA(k) is empty is checked first. If the plane address PA(k) is empty, the writing data LAA(n) is directly buffered to the plane address PA(k), otherwise the plane address PA(k) is already occupied by the logical allocation address LAA(n') of the earlier writing data. If the plane address PA(k) is already occupied and is not empty, the plane address of the writing data is reordered by shifting the next plane address. That is, the plane address PA(k+1) of the writing unit is obtained by using the residue k+1 of the sum of the address ordinal number n of the logical allocation address LAA(n) of the writing data plus 1 dividing the plane address number m. Then, the occupation state of the reordered plane address is checked again. If the plane address is not empty, the next plane address continues to be shifted. The shifting process is cyclically repeated on the writing unit until the reordered plane address is empty. Then, the writing data LAA(n) is buffered to the empty plane address.

Figure 6:
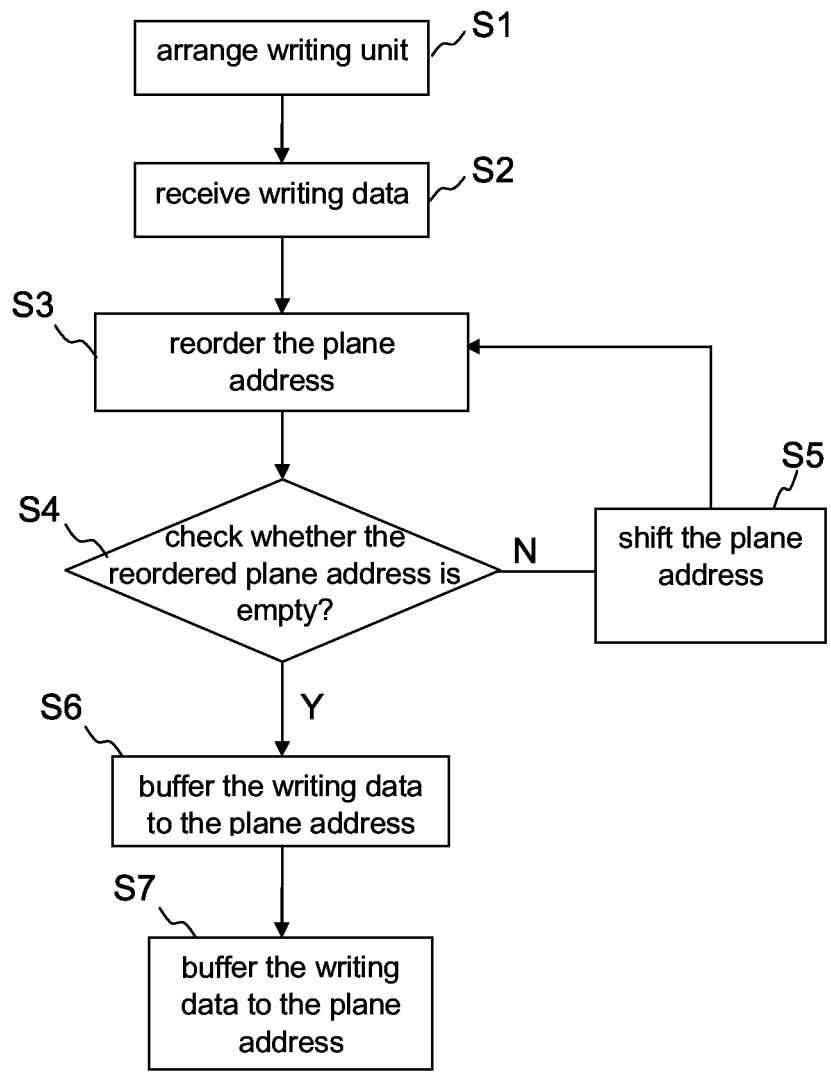
FIG. 6 is a flowchart of a reordering process of a writing method for a solid state disk according to an embodiment of the invention.

As indicated in FIG. 6, a flowchart of a reordering process of a writing method for a solid state disk according to an embodiment of the invention is shown. Detailed steps of reordering writing data in a writing method for a solid state disk are disclosed below. Firstly, the process begins at step S1, the solid state disk arranges a writing unit in a buffer memory, wherein plane addresses of the writing unit are in one-to-one correspondence with non-volatile memories. Next, the process proceeds to step S2, writing data with logical allocation address is received. Then, the process proceeds to step S3, the reordered plane address of the writing unit is obtained by using the residue of the address ordinal number of the logical allocation address of the writing data dividing the plane address number. Then, the process proceeds to step S4, whether the reordered plane address is empty is checked. If the reordered plane address is not empty, the process proceeds to step S5, the plane address is shifted by using the shifting technique, that is, the address ordinal number is added by 1, and the process returns to step S3 to repeat the reordering process until the reordered plane address is empty. If the reordered plane address is empty, the process proceeds to step S6, the writing data is directly buffered to the plane address. Then, the process proceeds to step S7, the solid state disk waits for a new instruction for processing next writing data or other operation.

In the above reordering process, the invention reorders the writing data according to the ranking of the logical allocation address by using the residue. For the reordered writing data with a non-empty plane address, the next plane address is shifted by using shifting technique. Although in the writing unit, the logical allocation address of the writing data cannot maintain its ideal arrangement based on the ranking of the logical allocation address, the logical allocation address of the writing data is basically arranged in the plane address of the writing unit according to the ranking of the logical allocation address LAA(n) of the writing data. When the writing unit is written to corresponding non-volatile memories, the order of the writing data in adjacent non-volatile memories will be the same as the ranking of the logical allocation address LAA(n) of the writing data.

Figure 7:
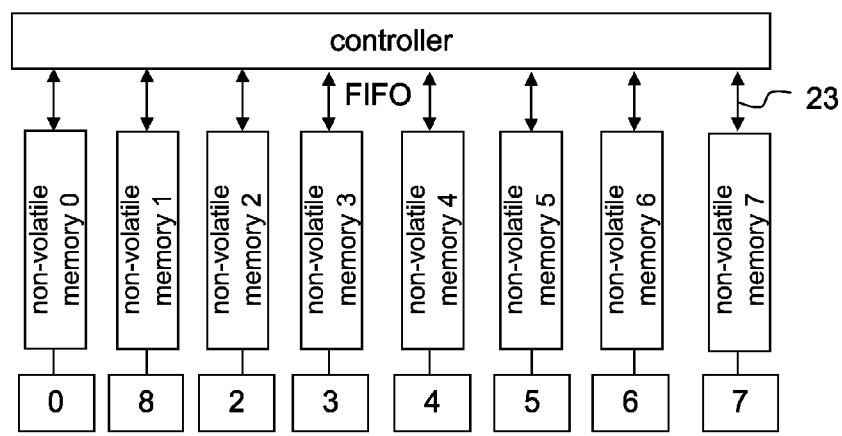
FIG. 7 is a schematic diagram of a first stage of data writing of a solid state disk according to an embodiment of the invention.
Figure 8:
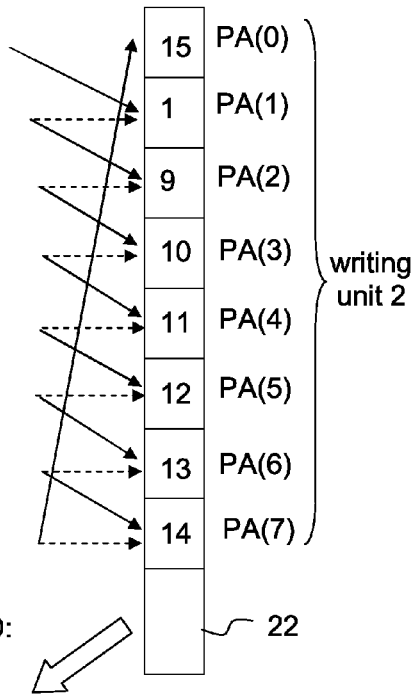
FIG. 8 is a schematic diagram of a second stage of data writing of a solid state disk according to an embodiment of the invention.
Figure 8:
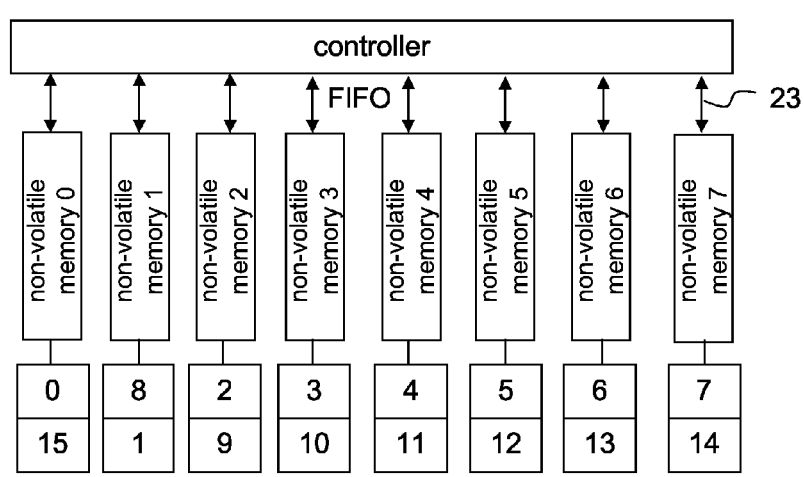

Refer to FIG. 7 and FIG. 8 at the same time. FIG. 7 is a schematic diagram of a first stage of data writing of a solid state disk according to an embodiment of the invention. FIG. 8 is a schematic diagram of a second stage of data writing of a solid state disk according to an embodiment of the invention. The data writing process of the solid state disk is exemplified with an embodiment below. In the first stage as indicated in FIG. 7, the solid state disk arranges a writing unit 1 in a buffer memory 22, wherein the writing unit 1 has 8 plane addresses PA(0), PA(1), PA(2), PA(3), PA(4), PA(5), PA(6), PA(7) which are in one-to-one correspondence with 8 non-volatile memories 0-7. Like the prior art, writing data LAA(0, 8, 2, 3, 4, 5, 6, 7, 1, 9, 10, 11, 12, 13, 14, 15) outputted by a host are received. For the firstly received writing data LAA(0), the reordered plane address PA(0) of the writing unit 1 is obtained by using the residue 0 of the address ordinal number 0 of the logical allocation address LAA(0) of the writing data dividing the plane address number 8. Then, whether the plane address PA(0) is empty is checked. If the plane address PA(0) is empty, the writing data LAA(0) is directly buffered to the plane address PA(0) of the writing unit 1 as indicated by a solid-line arrow. Then, whether the plane address of the writing unit 1 is full is checked. If the plane address of the writing unit 1 is not full, the solid state disk continues to receive a writing data.

For the secondly received writing data LAA(8), the reordered plane address PA(0) of the writing unit 1 is obtained by using the residue 0 of the address ordinal number 8 of the logical allocation address LAA(8) of the writing data dividing the plane address number 8. Since the plane address PA(0) is already occupied by the writing data LAA(0), the plane address PA(0) is non-empty. By using the shifting technique, the reordered plane address PA(1) is obtained by using the residue 1 of the sum of the address ordinal number 8 and 1 dividing the plane address number 8. Then, whether the plane address PA(1) is empty is checked. If the plane address PA(1) is empty, the writing data LAA(8) which would otherwise be buffered to the plane address PA(0) as indicated by a dashed arrow is now buffered to the plane address PA(1) of the writing unit 1 as indicated by a solid-line arrow. Then, whether the plane address of the writing unit 1 is full is checked. If the plane address of the writing unit 1 is not full, the solid state disk continues to receive a writing data.

For the subsequently received writing data LAA(2,3,4,5,6, 7), the reordered plane addresses PA(2), PA(3), PA(4), PA(5), PA(6), PA(7) of the writing unit 1 are respectively obtained. Since the plane addresses PA(2), PA(3), PA(4), PA(5), PA(6), PA(7) are all empty, the writing data LAA(2,3,4,5,6,7), like the writing data LAA(0), are directly buffered to the plane address PA(2), PA(3), PA(4), PA(5), PA(6), PA(7) of the writing unit 1 one by one as indicated by respective solid-line arrows. Then, whether the plane address of the writing unit 1 is full is checked one by one until the writing data LAA(7) is buffered to the reordered plane address PA(7). Then, if it is checked that the plane address of the writing unit 1 is full, the writing data LAA(0, 8, 2, 3, 4, 5, 6, 7) buffered in the plane addresses PA(0), PA(1), PA(2), PA(3), PA(4), PA(5), PA(6), PA(7) of the writing unit 1 are respectively written to the non-volatile memories 0, 1, 2, 3, 4, 5, 6, 7 of the solid state disk in order via the FIFO channels 23. Then, the writing unit 1 is emptied and ready for use and the first stage terminates here.

Then, the second stage of data writing of a solid state disk is elaborated below. As indicated in FIG. 8, firstly, the emptied writing unit 1 is arranged as a writing unit 2 in the buffer memory 22. In the present embodiment, although a writing unit is emptied and used as the next writing unit, a space can be found in the buffer memory 22 and arranged as the next writing unit such that the writing data can be buffered to the space as a cache. Then, the host continues to receive a writing data LAA(1), the reordered plane address PA(1) of the writing unit 2 is obtained by using the residue 1 of the address ordinal number 1 of the logical allocation address LAA(1) of the writing data dividing the plane address number 8. Then, whether the plane address PA(1) is empty is checked. If the plane address PA(1) is empty, the writing data LAA(1) is directly buffered to the plane address PA(1) of the writing unit 2 as indicated by a solid-line arrow. Then, whether the plane address of the writing unit 2 is full is checked. If the plane address of the writing unit 2 is not full, the solid state disk continues to receive a writing data.

For the secondly received writing data LAA(9), the reordered plane address PA(1) of the writing unit 2 is obtained by using the residue 0 of the address ordinal number 9 of the logical allocation address LAA(9) of the writing data dividing the plane address number 8. Since the plane address PA(1) is already occupied by the writing data LAA(1), the plane address PA(1) is non-empty. By using the shifting technique, the reordered plane address PA(2) is obtained by using the residue 2 of the sum of the address ordinal number 9 and 1 dividing the plane address number 8. Then, whether the plane address PA(2) is empty is checked. If the plane address PA(2) is not empty, the writing data LAA(9) which would otherwise be buffered to the plane address PA(1) as indicated by a dashed arrow is now buffered to the plane address PA(2) of the writing unit 2 as indicated by a solid-line arrow. Then, whether the plane address of the writing unit 2 is full is checked. If the plane address of the writing unit 2 is not full, the solid state disk continues to receive a writing data.

For the subsequently received writing data LAA(10,11,12, 13,14), the reordered plane addresses PA(2), PA(3), PA(4), PA(5), PA(6) of the writing unit 2 are respectively obtained. Since all the plane addresses PA(2), PA(3), PA(4), PA(5), PA(6) are non-empty, like the writing data LAA(9), the reordered plane addresses PA(3), PA(4), PA(5), PA(6), PA(7) of the writing unit 2 are obtained by using the shifting technique, that is, the address ordinal number is added by 1. Then, whether the plane address is empty is checked one by one. If the plane addresses PA(3), PA(4), PA(5), PA(6), PA(7) are not empty, the writing data which would otherwise be buffered to the plane addresses PA(2), PA(3), PA(4), PA(5), PA(6) as indicated by dashed arrows are now buffered to the plane addresses PA(3), PA(4), PA(5), PA(6), PA(7) as indicated by solid-line arrows. Then, whether the plane address of the writing unit 2 is full is checked. If the plane address of the writing unit 2 is not full, the solid state disk continues to receive a writing data.

For the lastly received writing data LAA(15), the reordered plane address PA(7) of the writing unit 2 is obtained by using the residue 7 of the address ordinal number 15 of the logical allocation address LAA(15) of the writing data dividing the plane address number 8. Since the reordered plane address PA(7) is already occupied by the writing data LAA(14) and it is checked that the plane address PA(14) is non-empty, the reordered plane address PA(0) is obtained by using the residue 0 of the sum of the address ordinal number 15 and 1 dividing the plane address number 8 by using the shifting technique. Then, whether the plane address PA(0) is empty is checked. If the plane address PA(0) is empty, the writing data LAA(15) which would otherwise be buffered to PA(7) as indicated by a dashed arrow is now buffered to the plane address PA(0) of the writing unit 2 as indicated by a solid-line arrow. Then, whether the plane address of the writing unit 2 is full is checked. Meanwhile, the writing data LAA(15,1,9,10, 11,12,13,14) buffered in the plane addresses PA(0)-PA(7) of the writing unit 2 are written to the corresponding non-volatile memories 0-7 via the FIFO channels 23. When the host needs to read data LAA(0,1,2,3,4,5,6,7), the FIFO channels will not be jammed because the writing data LAA(0) and LAA(1) are respectively written to the non-volatile memory 0 and the non-volatile memory 1. Therefore, in the first schedule, the writing data LAA(0,1,2,3,4,5,6,7) have already read in parallel, and the read rate can thus be increased.

Figure 9:
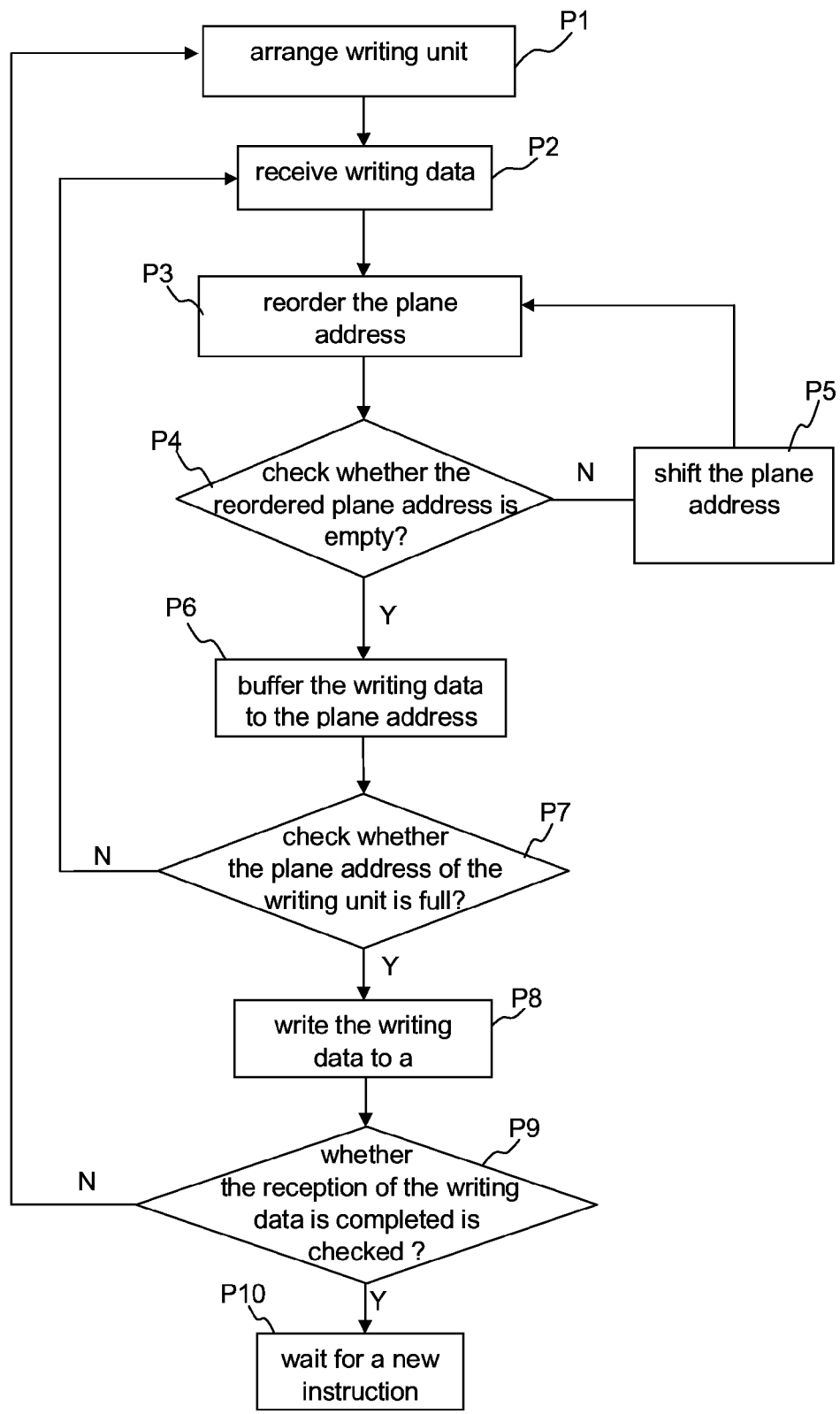
FIG. 9 is a flowchart of a writing method for a solid state disk according to an embodiment of the invention.

As indicated in FIG. 9, a flowchart of a writing method for a solid state disk according to an embodiment of the invention is shown. Detailed steps of the writing method for a solid state disk are disclosed below. Firstly, the method begins at step P1, the solid state disk arranges a writing unit in a buffer memory. Next, the method proceeds to step P2, writing data is received from a host. Then, the method proceeds to step P3, the reordered plane address of the writing unit is obtained by using the residue of the address ordinal number of the logical allocation address of the writing data dividing the plane address number. Then, the method proceeds to step P4, whether the reordered plane address is empty is checked. If the reordered plane address is not empty, the method proceeds to step P5, the plane address is shifted by using the shifting technique, that is, the address ordinal number is added by 1, and the process returns to step P3 to cyclically repeat the reordering process until the reordered plane address is empty. If the reordered plane address is empty, the method proceeds to step P6, the writing data is directly buffered to the plane address.

Then, the method proceeds to step P7, whether the plane address of the writing unit is full is checked. If the writing unit is not full, the method returns to step P2, the solid state disk continues to receive writing data from the host. If the writing unit is full, the method proceeds to step P8, the writing data buffered in the plane address of the writing unit is written to a corresponding non-volatile memory. Then, the method proceeds to step P9, whether the reception of the writing data is completed is checked. If the reception of the writing data is not completed, the method returns to step P1, the solid state disk continues to arrange a next writing unit. If the reception of the writing data is completed, the method proceeds to step P10, the solid state disk waits to receive a new instruction from the host.

Through the steps of the writing method for a solid state disk disclosed above, the writing data can be buffered to the plane address of the writing unit obtained by using the residue of the address ordinal number of the logical allocation address of the writing data dividing the non-volatile memory number or the plane address number of the writing unit. For a non-empty plane address that has been occupied, the writing data is buffered to the next plane address of the writing unit by using the shifting technique. By doing so, the order of the writing data in adjacent non-volatile memories will be the same as the ranking of the logical allocation address of the writing data, and the read rate can thus be increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A writing method for a solid state disk, comprising steps of:
   (1) arranging a writing unit in a buffer memory of the solid state disk, wherein plane addresses of the writing unit are in one-to-one correspondence with non-volatile memories of the solid state disk;
   (2) receiving a writing data having logical allocation address;
   (3) obtaining a reordered plane address of the writing unit by using a residue of an address ordinal number of the logical allocation address of the writing data dividing a plane address number;
   (4) if the reordered plane address which is checked is not empty, the address ordinal number is added by 1 by using a shifting technique, and the method returns to step (3) to repeat the reordering process;
   (5) the reordered plane address which is checked is empty, the writing data is buffered to the reordered plane address; and
   (6) waiting for a next instruction.

2. The writing method for a solid state disk according to claim 1, wherein, the writing unit cyclically shifts the next plane address by using the shifting technique until the reordered plane address is empty, and then the writing data is buffered to the empty reordered plane address.

3. The writing method for a solid state disk according to claim 1, wherein after the writing data is buffered in the step (5), if the plane address of the writing unit is not full, the method returns to step (2) to continue receiving the writing data.

4. The writing method for a solid state disk according to claim 3, wherein after the writing data is buffered in the step (5), if the plane address of the writing unit is full, the writing data buffered in the plane address of the writing unit is written to a corresponding non-volatile memory.

5. The writing method for a solid state disk according to claim 4, wherein after the writing unit is written to the non-volatile memory, if the reception of the writing data is not completed, the method returns to step (1) to continue arranging the writing unit.

6. The writing method for a solid state disk according to claim 5, wherein after the writing unit is written to the non-volatile memory, if the reception of the writing data is completed, the method waits for the next instruction.

7. The writing method for a solid state disk according to claim 1, wherein the arranged writing unit is a writing unit that has been emptied and used as a next writing unit.

8. The writing method for a solid state disk according to claim 1, wherein the arranged writing unit is a space found in the buffer memory and used as a next writing unit.

* * * * *